US011733322B1

United States Patent
Montoya et al.

(10) Patent No.: US 11,733,322 B1
(45) Date of Patent: Aug. 22, 2023

(54) SQUID ARRAY WITH NON-UNIFORM WIRE GEOMETRY FOR DETECTING MAGNETIC FIELDS OVER A BROAD OPERATIONAL TEMPERATURE RANGE

(71) Applicant: United States of America as represented by the Secretary of the Navy, San Diego, CA (US)

(72) Inventors: Sergio A. Montoya, Chula Vista, CA (US); Benjamin J. Taylor, Escondido, CA (US); Anna Leese de Escobar, Encinitas, CA (US); Jenna Jones, Campo, CA (US)

(73) Assignee: United States of America as by the Secretary of the Navy, Washington, DC (US)

(*) Notice: Subject to any disclaimer, the term of this patent is extended or adjusted under 35 U.S.C. 154(b) by 0 days.

(21) Appl. No.: 17/857,927

(22) Filed: Jul. 5, 2022

(51) Int. Cl.
G01R 33/54 (2006.01)
G01R 33/035 (2006.01)

(52) U.S. Cl.
CPC .................. *G01R 33/0354* (2013.01)

(58) Field of Classification Search
CPC .............. G01R 33/0354; G01R 33/00; G01R 33/0035; G01R 33/0023; G01R 33/0017; G01R 31/3191; G01R 33/0358; G01R 33/0356; G01B 7/004; G01C 17/38; G06F 3/017; G06F 3/0346; G06F 3/012; H01L 39/223
See application file for complete search history.

(56) References Cited

U.S. PATENT DOCUMENTS

| 8,179,133 B1 * | 5/2012 | Kornev | G01R 33/0354 324/225 |
| 10,224,475 B2 | 3/2019 | Cybart et al. | |
| 2012/0088674 A1* | 4/2012 | Faley | G01R 33/0354 505/150 |
| 2016/0149111 A1 | 5/2016 | Cybart et al. | |

OTHER PUBLICATIONS

F. Cuoedo et al.; High-Tc superconducting detector for highly-sensitive microwave magnetometry; Appl. Phys. Lett. 114, 192602 (2019).
A. Labbe' et al.; Effects of flux pinning on the DC characteristics of meander-shaped superconducting quantum interference filters with flux concentrator; J. Appl. Phys. 124, 214503 (2018).
E. E. Mitchell et al.; 2D SQIF arrays using 20 000 YBCO high Rn Josephson junctions; Supercond. Sci. Technol. 29, 06LT01 (2016).
B. Muller et al.; Josephson Junctions and SQUIDs Created by Focused Helium-Ion-Beam Irradiation of YBCO; Phys Rev Applied 11, 044082 (2019).
G. V. Prokopenko; DC and RF Measurements of Serial Bi-SQUID Arrays; arXiv:1212.3748v1 [physics.ins-det] (2012).

* cited by examiner

*Primary Examiner* — Jermele M Hollington
*Assistant Examiner* — Taqi R Nasir
(74) *Attorney, Agent, or Firm* — Naval Information Warfare Center, Pacific; Kyle Eppele; James Eric Anderson

(57) ABSTRACT

A magnetic field detector for detecting magnetic fields over a broad operational temperature range comprising: a plurality of Josephson junctions connected to each other by superconducting interconnecting paths, wherein the plurality of Josephson junctions are arranged in an array; and wherein the superconducting interconnecting paths connecting the plurality of Josephson junctions in the array are designed to not all have a uniform cross-sectional geometry with respect to each other.

20 Claims, 7 Drawing Sheets

SQUID ARRAY WITH NON-UNIFORM WIRE GEOMETRY FOR DETECTING MAGNETIC FIELDS OVER A BROAD OPERATIONAL TEMPERATURE RANGE

FEDERALLY-SPONSORED RESEARCH AND DEVELOPMENT

The United States Government has ownership rights in this invention. Licensing and technical inquiries may be directed to the Office of Research and Technical Applications, Naval Information Warfare Center Pacific, Code 72120, San Diego, Calif., 92152; voice (619) 553-5118; ssc_pac_t2@navy.mil. Reference Navy Case Number 112107.

BACKGROUND OF THE INVENTION

A superconducting quantum interference device (SQUID) is a superconductor material loop containing at least one Josephson junction which allows for the measurement of magnetic flux when a magnetic field threads the superconducting loop. A SQUID array is a single superconducting circuit typically comprised of many (e.g., ~10 to a million) individual SQUID elements that are connected in one-, two- and three-dimensional configurations.

SUMMARY

Disclosed herein is a magnetic field detector for detecting magnetic fields over a broad operational temperature range comprising a plurality of Josephson junctions arranged in an array and connected to each other by superconducting interconnecting paths. The superconducting interconnecting paths connecting the plurality of Josephson junctions in the array are designed to not all have a uniform cross-sectional geometry with respect to each other.

An embodiment of the magnetic field detector is also disclosed herein and described as a superconducting quantum interference apparatus comprising a grid of superconducting paths and a plurality of SQUIDs. The plurality of SQUIDs is disposed in an array on the grid of superconducting paths that are configured to connect the plurality of SQUIDs to each other. A section of the grid of superconducting paths has a different cross-sectional geometry with respect to a cross-sectional geometry of remaining sections in the grid.

An embodiment of the magnetic field detector is also disclosed herein as comprising a plurality of Josephson junctions that are arranged in an array and connected to each other by superconducting interconnecting paths. In this embodiment, at least one of the Josephson junctions in the array has a different junction cross-sectional geometry relative to remaining Josephson junctions in the array such that the Josephson junctions in the array are not all uniform.

BRIEF DESCRIPTION OF THE DRAWINGS

Throughout the several views, like elements are referenced using like references. The elements in the figures are not drawn to scale and some dimensions are exaggerated for clarity.

DETAILED DESCRIPTION OF EMBODIMENTS

The disclosed apparatus below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other methods and systems described herein as will be understood by one of ordinary skill in the art unless otherwise stated specifically.

Figure 1:
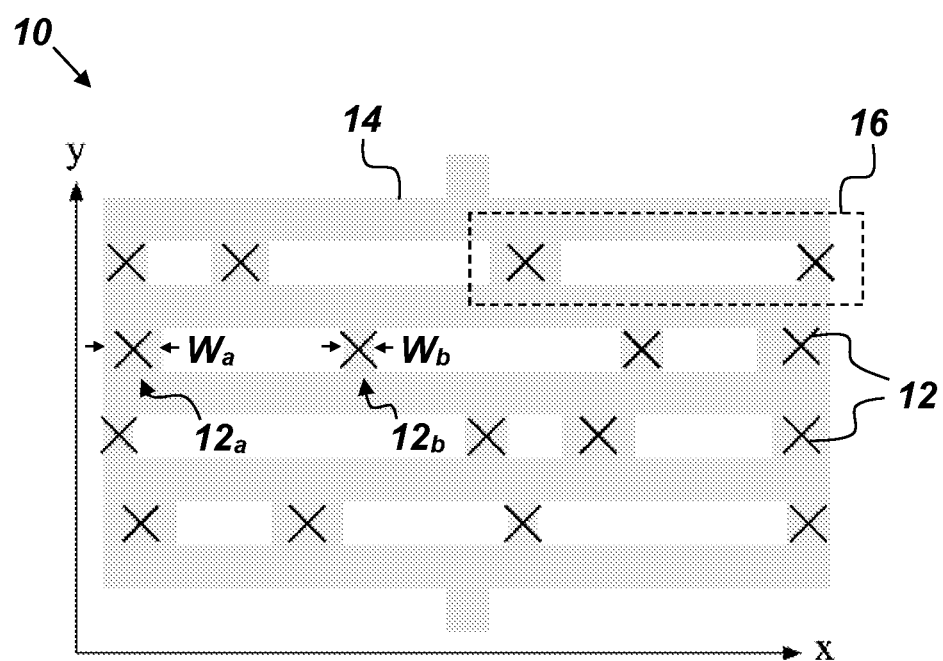
FIG. 1 is a top-view illustration of an embodiment of a magnetic field detector.

FIG. 1 is a top-view illustration of an embodiment of a magnetic field detector 10 that is capable of detecting magnetic fields over a broad operational temperature range. The magnetic field detector 10 comprises, consists of, or consists essentially of a plurality of Josephson junctions 12 that are connected to each other by superconducting interconnecting paths 14. Each symbol (X) denotes an area where a Josephson junction 12 is positioned along the superconducting interconnecting paths 14. The plurality of Josephson junctions 12, in this embodiment, are arranged in a planar SQUID array and the superconducting interconnecting paths 14 are designed to not all have a uniform cross-sectional geometry with respect to each other. The planar SQUID array shown in FIG. 1 includes a plurality of SQUIDs 16, but it is to be understood that the magnetic field detector 10 is not limited to the arrangement shown in FIG. 1, but may have any desired number of Josephson junctions 12 or SQUIDs 16 arranged in any desired fashion. In the embodiment of the magnetic field detector 10 shown FIG. 1, the width W of the superconducting interconnecting paths 14 (also referred to as traces herein) is not uniform across the array of SQUIDs 16. To illustrate, the width $W_a$ of the superconducting path 14 in the region of Josephson junction $12_a$ is wider than the width $W_b$ of the superconducting path 14 in the region of Josephson junction $12_b$.

Fabricating superconducting interconnecting paths 14 and Josephson junctions 12 with different cross-sectional dimensions can be accomplished through a number of methods including, but not limited to: (1) controlling the width of the regions of the film where the Josephson junctions are formed in the standard lithography process, and (2) thinning the film in the region of Josephson junction to reduce the thickness (height of junction). For example, the circuit may be masked in a manner so as to leave the junction regions exposed, then one or more of the following method steps may be applied: (a) applying an ion milling plasma to remove a portion of the film, (b) applying an oxygen plasma to form an insulation layer to reduce the thickness of the superconducting region of the film, (c) exposing the film to a chemical process which forms an insulating layer to reduce the thickness of the superconducting region of the film. Another method of fabricating superconducting interconnecting paths 14 and Josephson junctions 12 with different cross-sectional dimensions may involve the use of a focused (helium, argon, neon, gallium, etc) ion beam to directly alter the width and/or height of the junction region.

One preferred method for fabricating the superconducting paths 14 of the magnetic field detector 10 is through the use of top-down, ultraviolet (UV) photolithography techniques, which enable defining intricate circuits with wide-ranging microscale feature size on a desired superconductor material(s). In other words, a material with desired properties can be synthesized and then a photolithography process may be used to pattern the desired geometrical features (e.g., superconducting paths 14) and/or circuits. It is preferable that the photolithography process minimally affects the intrinsic properties of the superconductor and the circuit layout exploits the superconductor's properties. Top-down nanofabrication (e.g., electron beam lithography, ion-beam lithography) techniques may be utilized for developing large-scale embodiments of the magnetic field detector 10 with nanoscale superconducting paths 14 and Josephson junctions 12. In real-world implementation, the development of large-scale nanometer scale circuits uses a combination of UV photolithography and nanofabrication techniques (cost-efficient), or an Extreme UV light source in the photolithography to directly achieve nanometer scale features. Bottom-up photolithography techniques may also be used, where blank traces are imprinted on a substrate and then the desired material is grown/synthesized over the entire substrate (i.e., one is filling all the traces). A downside with this approach is the reduced ability to properly control the material composition (or even achieve/grow a material with a crystal structure) inside the traces; also, if the trace geometry changes, its likely many traces cannot be equally filled as others (edge effects during the deposition). Another suitable method for fabricating the magnetic field detector 10 includes, but is not limited to, the use of nanowires (where individual crystal wires are laid in the desired pattern). For making a Josephson junction 12 on the superconducting circuit, there are different techniques which may be used: multilayer, ramp-edge, step-edge, nano-bridge, and ion-damaged (i.e., the most conventional techniques).

The magnetic field detector 10 is a superconducting device capable of efficiently detecting the magnetic-field component of electromagnetic radiation over a broad temperature window. The magnetic field detector 10 enables the construction of robust superconducting devices that can be exposed to direct and/or indirect environmental and equipment thermal fluctuations and/or variations as well as thermal gradient variations that occur in the cryogenic temperature stage where superconducting electronics are placed. The magnetic field detector 10 accounts for inevitable sources of thermal heat fluctuation and/or variations. The magnetic field detector 10 may be used to fabricate superconducting quantum interference device arrays that do not require high-fidelity temperature control to operate efficiently.

The temperature-dependent direct current (DC) and alternating current (AC) response of a SQUID or SQUID array depends on the superconductor material used to fabricate the SQUID elements, the tunnel barrier material which comprises the Josephson junction (commonly an insulator), the geometry of individual SQUID elements (e.g. trace volume, loop area, tunnel barrier volume, etc.), the geometry configuration of individual SQUID elements in the SQUID array, the applied DC current, and the applied DC magnetic field. Since SQUID arrays are frequency-independent, they are good candidates to fabricate high sensitivity electromagnetic sensors.

Figure 2:
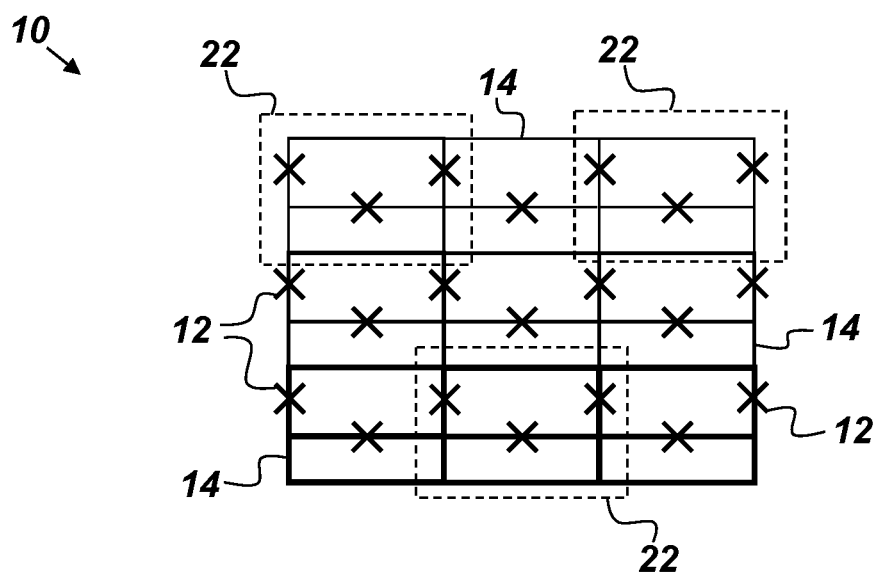
FIG. 2 is a top-view illustration of an embodiment of a magnetic field detector.

The constituent Josephson junctions 12 of the magnetic field detector 10 may be any type of Josephson junction 12 such as, but not limited to, superconductor proximity effect junctions, ion-damaged junctions, step-edge junctions, multi-layered junctions, ramp-edge junctions, nano-bridge (e.g., Dayem-bridge) junctions, and superconductor-metal tunnel junctions. The Josephson junctions 12 may also be organized into bi-superconducting quantum interference device (bi-SQUIDs), where each bi-SQUID comprises two Josephson junctions in a superconducting loop and a third Josephson junction in a superconducting path that bisects the superconducting loop such as shown in FIG. 2. The superconducting interconnecting paths 14 may be made of high temperature superconductor (HTS) material or low temperature superconductor (LTS) material.

FIG. 2 is a top-view illustration of an embodiment of the magnetic field detector 10 which includes an array of bi-SQUIDs 22 connected with superconducting interconnecting paths 14 that are not all uniform. As shown in FIG. 2, at least one superconducting interconnecting path 14, that connects any two Josephson junctions 12, exhibits a volume-geometry difference relative to the remaining superconducting interconnecting paths 14 that connect remaining Josephson junctions 12 in the array. In FIGS. 1 and 2, the SQUIDs 16 and the bi-SQUIDs 22 are respectively shown as being arrayed in a uniform manner.

Figure 3:
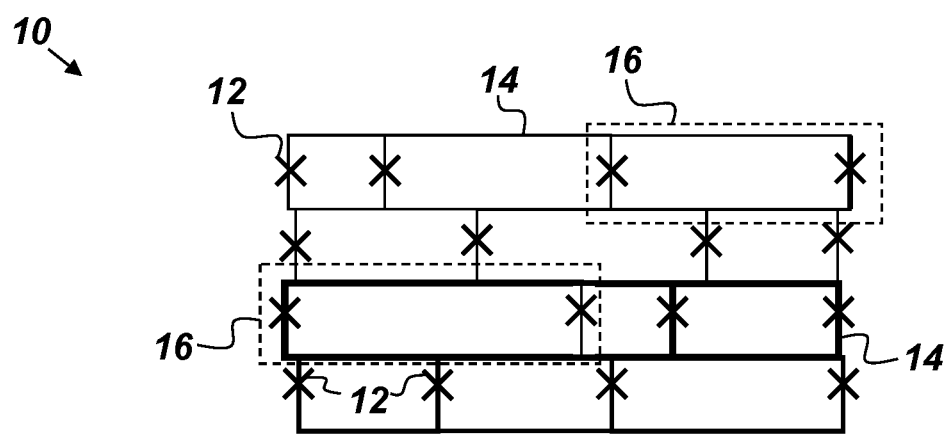
FIG. 3 is a top-view illustration of an embodiment of a magnetic field detector.

FIG. 3 is a top-view illustration of an embodiment of the magnetic field detector 10 which includes an overall non-uniform array of SQUIDs 16 connected with superconducting interconnecting paths 14 that are not all uniform where some of the SQUIDs 16 are made up of superconducting paths 14 that are not all uniform. In this embodiment, at least one superconducting interconnecting path 14, that connects any two Josephson junctions 12, exhibits a volume-geometry difference relative to the remaining superconducting interconnecting paths 14 that connect remaining Josephson junctions 12 in the array. In superconductor materials, as the geometry of an interconnecting path 14 or Josephson junction 12 is reduced from bulk to constrained features the critical temperature (temperature below which the material exhibits a superconducting phase) will decrease (assuming a fixed current is applied). One may tune the inductance and capacitance of the magnetic field detector 10, which directly facilitates tuning the temperature-dependent maximum differential resistance, by modifying the overall geometry of the SQUID array (e.g., width, length), number of columns and rows, number of Josephson junction in each row and column, and finally the individual SQUID loop area. When the latter are optimized, one can achieve SQUID arrays with either symmetric or asymmetric distribution of Josephson junctions that exhibit maximum differential resistance. By introducing a volumetric variation in the interconnecting path geometry, one can introduce an additional degree of tunability, which facilitates designing SQUID arrays that exhibit multiple temperature-dependent maxima differential resistance.

Figure 4:
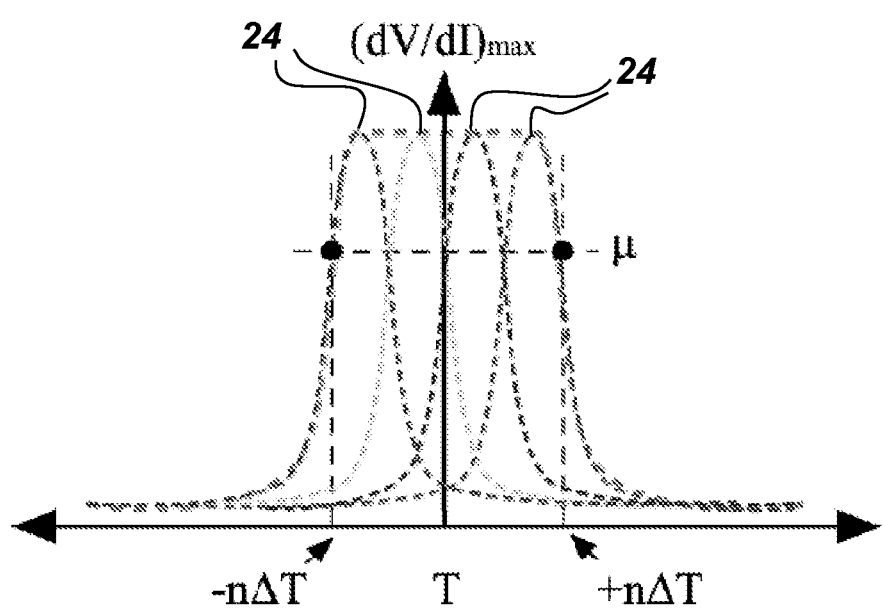
FIG. 4 is a plot of multiple temperature-dependent maxima differential resistances.

FIG. 4 is a plot of multiple temperature-dependent maxima differential resistance 24 for a 4×4 SQUID 16 array with non-uniform distribution of Josephson junctions 12 where the interconnecting paths 14 do not all have a uniform volume-geometry. The value of the Josephson junction 12 critical current density, $J_c^{JJ}$, may be determined by intrinsic physical properties of the superconducting material—including carrier density, carrier mass, and kinetic energy—and by properties of the tunnel junction, including tunneling barrier strength and the distance across the junction (tunneling length). In general, the temperature dependence, T, of a given Josephson junction critical current follows a form such that, $$J_c^{JJ} = J^{JJ}(0)[1-(T/T_c^{JJ})^n]^m \qquad \text{(Eq. 1)}$$

where J(0) is the zero-temperature value of the given Josephson junction critical current, $T_c^{JJ}$ is the critical temperature at which the junction becomes superconducting, and n and m are exponents with values empirically found to be n≈2, and m≈2–3. With the exception of ion-damaged Josephson junctions, the superconducting critical temperature of a given Josephson junction is the same as the film (bulk) material from which it is made, i.e., $T_c^{JJ} = T_c^{film}$. With respect to ion-damaged Josephson junctions, given that the process by which ion-damaged Josephson junctions are formed also involves some damage to the material in the region immediately outside the junction, the value of $T_c^{film}$ in this region is lowered, resulting in $T_c^{JJ} < T_c^{film}$.

The Josephson junction critical current, $I_c^{JJ}$, is simply related to $J_c^{JJ}$, by the cross-sectional dimensions of the junction, such that $I_c^{JJ} = A\ J_c^{JJ}$, where A=t×w, with t the thickness of the junction and w the width. Then, with the above temperature dependence of $J_c^{JJ}$ and the geometric relationship between $I_c^{JJ}$ and $J_c^{JJ}$, embodiments of the magnetic field detector 10 may be constructed to include an array of Josephson junctions, $J_{c\ \{x_i,y_i\}}^{JJ}(T)$, distributed in a two-dimensional area that may be subject to a non-uniform thermal distribution. If a Josephson junction-based device is designed such that optimal performance is achieved when all junctions have a specific value (within a small range of variation) of critical current which is achieved at a specific (optimal) temperature, T*, then, if the device were subjected to a sufficiently large non-uniform thermal distribution, the values of the critical current would be out of the targeted range, and the device's performance would be degraded or disrupted. If the thermal distribution is known in advance, then the areas of the junctions of the magnetic field detector 10 can be tailored to bring the spatial distribution of the values of $J_c^{JJ}(x_i, y_j;\ T(x_i, y_j))$ back to the targeted optimal range—restoring optimal performance. This may be accomplished by varying the width or thickness, or a combination width and thickness, of the Josephson junctions 12 within the magnetic field detector 10. In the case of controlling $I_c^{JJ}$ via the junction width, we must then satisfy:

$$I_c^{JJ}(x_i,y_i;T(x_i,y_i)) = t_{JJ} w_{JJ}(x_i,y_j) J_c^{JJ}(x_i,y_i;\ T(x_i,y_i)) = I_c^* \pm \delta I_c \qquad \text{(Eq. 2)}$$

Then, for one given temperature profile across the magnetic field detector 10, all Josephson junctions 12 will have the same value of $I_c^{JJ} = I_c^*$. See FIG. 5

Figure 5:
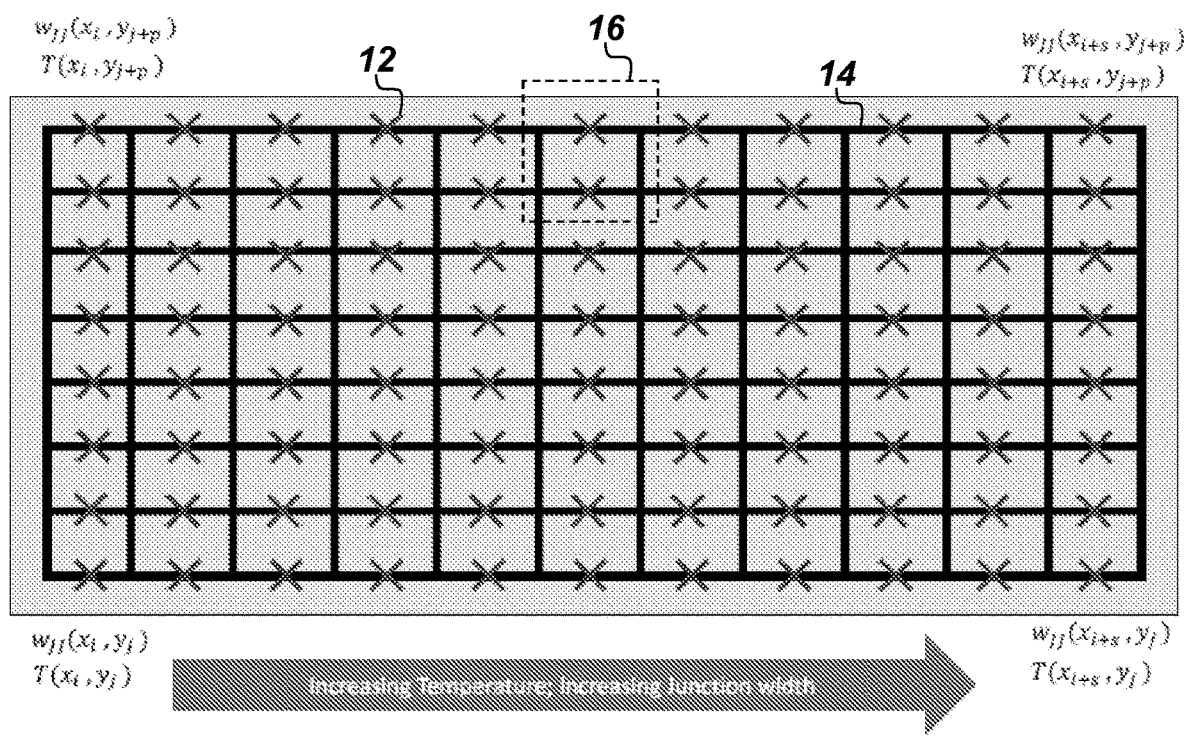
FIG. 5 is a top-view illustration of an embodiment of a magnetic field detector.

FIG. 5 is an illustration of an embodiment of the magnetic field detector 10 that comprises a two-dimensional array of SQUIDs 16 where the volume geometries of the Josephson junctions 12 are not uniform across the array. In this embodiment, the cross-sectional geometry of the interconnecting paths 14 and the positioning of the SQUIDs 16 are uniform, but the junction widths of the Josephson junctions 12 increase from left to right across the array shown in FIG. 5.

Figure 6A:
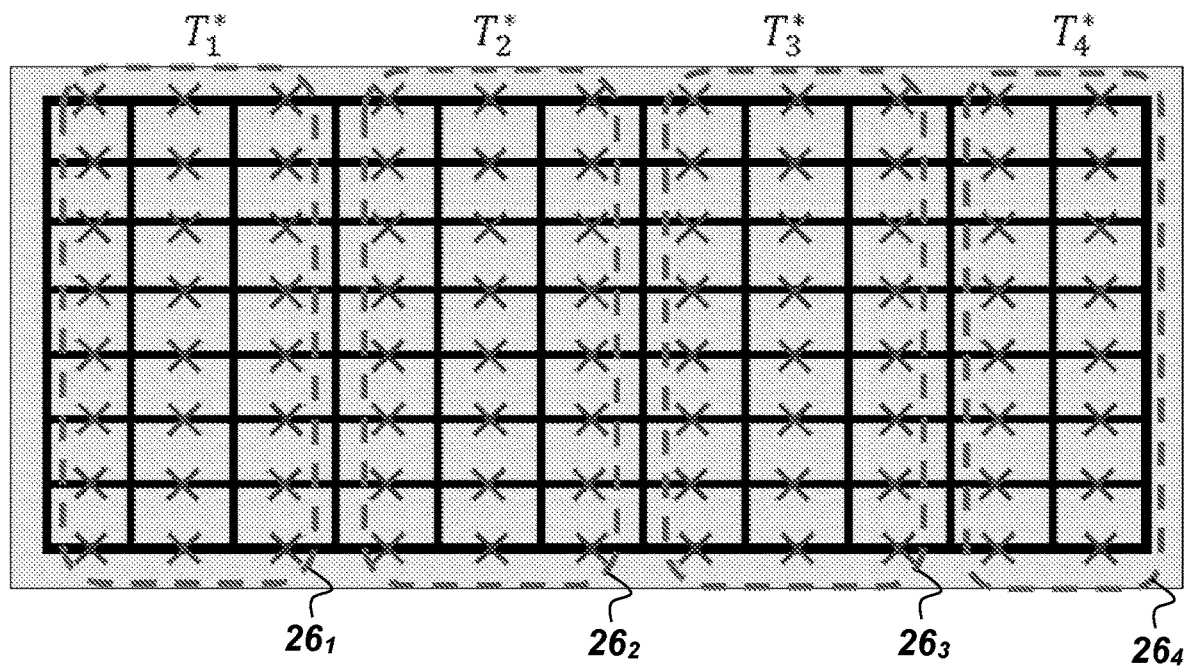
FIG. 6A is a top-view illustration of an embodiment of a magnetic field detector.

FIG. 6A is an illustration of an embodiment of the magnetic field detector 10 that comprises interconnected sub-sections 26, each of which may be designed to have a distinct temperature at which optimal performance is achieved. It may be acceptable in some use cases for an embodiment of the magnetic field detector 10 to be operated at less-than optimal performance, and to still be able perform its intended function. These sub-sections 26 can be distributed spatially to match a known, or likely encountered thermal distribution so as to bring as many regions as possible at, or close to, an optimal performance level. For example, in FIG. 6A, the first sub-section $26_1$ corresponds to a first optimal performance temperature $T_1^*$, the second sub-section $26_2$ corresponds to a second optimal performance temperature $T_2^*$, the third sub-section $26_3$ corresponds to a third optimal performance temperature $T_3^*$, and the fourth sub-section $26_4$ corresponds to a fourth optimal performance temperature $T_4^*$.

Figure 6B:
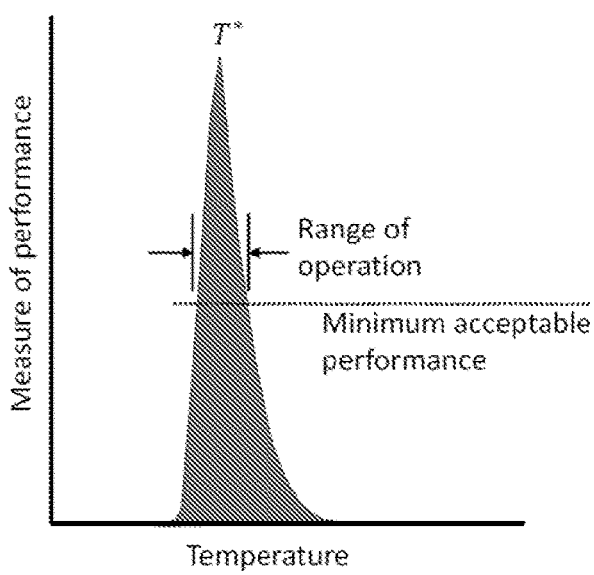
FIG. 6B is a plot of performance levels at different temperatures for a superconducting device having a singular optimal operating temperature.
Figure 6C:
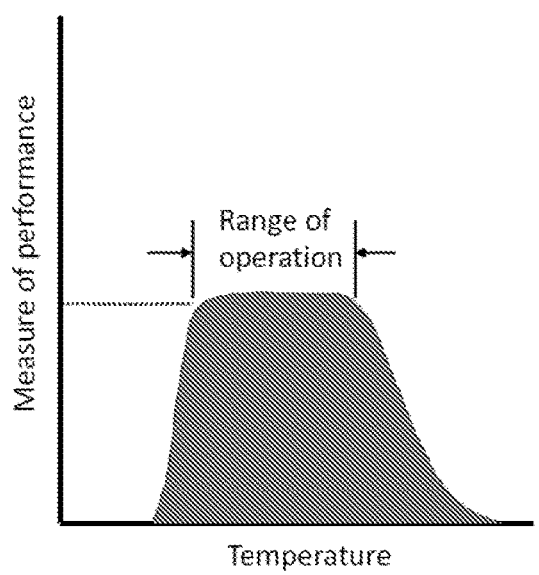
FIG. 6C is a plot of performance levels at different temperatures for an embodiment of the magnetic field detector having multiple sub-sections, each with its own optimal operating temperature such that the magnetic field detector, as a whole, exhibits uniform performance over a relatively broad range of temperatures.

If an embodiment of the magnetic field detector 10 with sub-sections 26, such as is shown in FIG. 6A, is subjected to a uniform thermal distribution which varies over a given range with time, each sub-section 26 may be configured to have a distinct optimal operational temperature so that at any given time at least one sub-section 26 is operating at its optimal operational temperature, and other sub-sections 26 are within an acceptable degraded level of performance. The net result will be a less-than optimal (but still acceptable) device having uniform performance over a range of temperatures such as shown in FIG. 6C, — in contrast to a higher performing device with a singular optimal operating temperature, and increased degraded performance as the temperature deviates, which performance is illustrated in the plot in FIG. 6B.

Planar and three-dimensional embodiments of the magnetic field detector 10 may be fabricated using a combination of microfabrication (e.g. UV photolithography) and nanofabrication (e.g. ion-beam lithography, electron beam lithography) techniques, depending on the geometrical feature size that is desired. The SQUIDs 16 or bi-SQUIDs 22 that are included in the magnetic field detector 10 may be arranged in any desired arrangement. For example, in one embodiment of the magnetic field detector 10, the SQUIDs 16 are off-centered with respect to each other in the array such that the spatial arrangement of SQUIDs 16 is configured to detect an amplitude and phase of radio frequency (RF) signals. Suitable spatial arrangements of the SQUIDs 16 that may be used to detect one or both of circular- and elliptical-polarized RF signals include, but are not limited to a pair of rectangular geometry arrays, a triangular array, a circular array, and a Lorentz array. The magnetic field detector 10 is able to detect direct current (DC) and alternating current (AC) magnetic fields.

Figure 7:
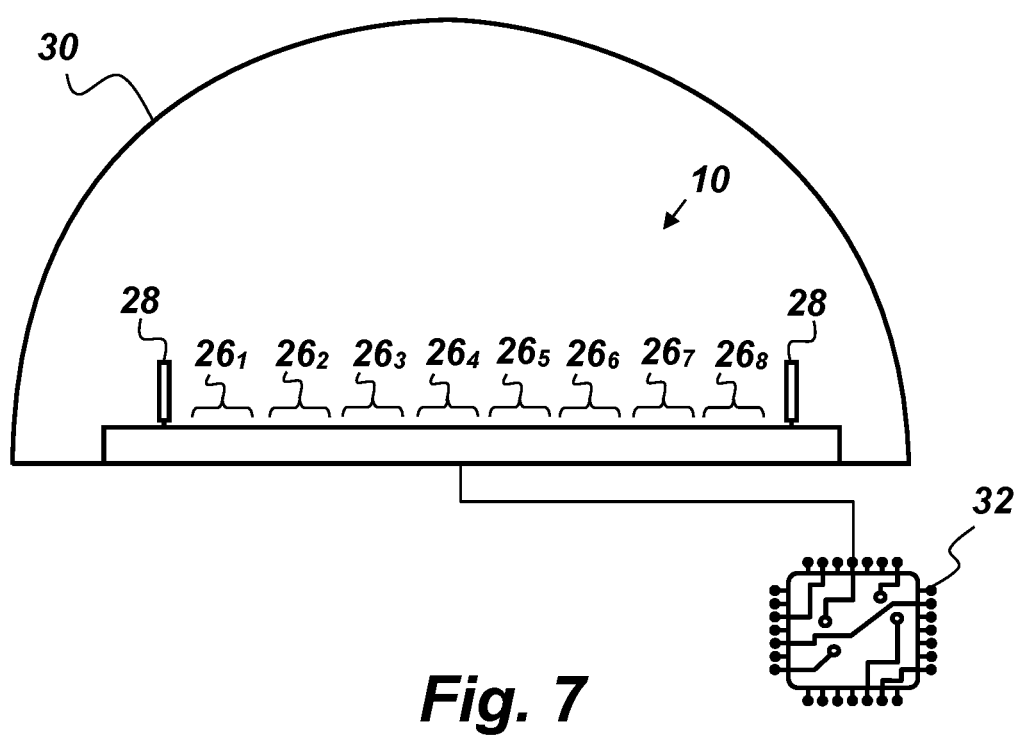
FIG. 7 is a side-view illustration of an embodiment of a magnetic field detector.

FIG. 7 is an illustration of another embodiment of the magnetic field detector 10 that comprises a temperature sensor 28 configured to measure a local temperature, i.e., the temperature proximate to the magnetic field detector 10 within a cryostat 30. This embodiment of the magnetic field detector 10, i.e., the embodiment shown in FIG. 7, also comprises a processor 32 and the array of SQUIDs is divided into sub-sections 26, each of which comprises Josephson junctions designed to operate optimally at a distinct optimal temperature. The processor 32 is communicatively coupled to the temperature sensor 28 and to the Josephson junctions and may be configured to gate out the output from certain sub-sections if their corresponding optimal temperatures fall outside an acceptable temperature range based on the local temperature. It is to be understood that the magnetic field detector is not limited to a single temperature sensor 28, but may include any desired number of temperature sensors.

Further, it is to be understood that the processor 32 may be placed within the cryostat 30 or placed at the same, or similar, cryogenic temperature stage as within the cryostat 30. It may be beneficial for data captured by the magnetic field detector 10 to be processed at cryogenic temperatures (via superconducting electronics) to minimize data corruption when moving data across different temperature environments (thermal noise yields more errors). In FIG. 7, the magnetic field detector 10 is shown as having two temperature sensors 28 spaced apart and positioned so as to be able to measure a temperature gradient across the magnetic field detector 10 such that the processor is able to determine the different spatial temperatures. The temperature sensors 28 may be passive so they may be turned on/off only when necessary to avoid introducing heat into the circuit. In some embodiments, a separate temperature sensor 28 may be configured to measure the temperature at a corresponding sub-section such that the processor may know whether or not a given sub-section is at its distinct optimal temperature. In practice, fabrication can introduce morphological variations in the magnetic field detector 10, which can introduce a nonlinear temperature gradient across the detector. For this reason, more than two temperature sensors 28 may be desired for a given embodiment of the magnetic field detector 10.

From the above description of the magnetic field detector 10, it is manifest that various techniques may be used for implementing the concepts of the magnetic field detector 10 without departing from the scope of the claims. The described embodiments are to be considered in all respects as illustrative and not restrictive. The method/apparatus disclosed herein may be practiced in the absence of any element that is not specifically claimed and/or disclosed herein. It should also be understood that the magnetic field detector 10 is not limited to the particular embodiments described herein, but is capable of many embodiments without departing from the scope of the claims.

We claim:

1. A magnetic field detector for detecting magnetic fields over a broad operational temperature range comprising:
    a plurality of Josephson junctions connected to each other by superconducting interconnecting paths, wherein the plurality of Josephson junctions are arranged in an array; and
    wherein the superconducting interconnecting paths connecting the plurality of Josephson junctions in the array are designed to not all have a uniform cross-sectional geometry with respect to each other.

2. The magnetic field detector of claim 1, wherein the plurality of Josephson junctions are organized into superconducting interference devices (SQUIDs), wherein each SQUID comprises two Josephson junctions connected to each other by a superconducting connecting path.

3. The magnetic field detector of claim 1, wherein the plurality of Josephson junctions are organized into bi-superconducting quantum interference device (bi-SQUIDs), wherein each bi-SQUID comprises two Josephson junctions in a superconducting loop and a third Josephson junction in a superconducting path that bisects the superconducting loop.

4. The magnetic field detector of claim 1, wherein at least one superconducting interconnecting path that connects any two Josephson junctions exhibits a volume-geometry difference relative to remaining superconducting interconnecting paths that connect remaining Josephson junctions in the array.

5. The magnetic field detector of claim 1, wherein the superconducting interconnecting paths are made of high temperature superconductor material.

6. The magnetic field detector of claim 1, wherein the superconducting interconnecting paths are made of low temperature superconductor material.

7. The magnetic field detector of claim 2, wherein the superconducting interconnecting paths form a grid and the SQUIDs are disposed in the grid in a uniform manner.

8. The magnetic field detector of claim 2, wherein the superconducting interconnecting paths form a grid and the SQUIDs are disposed in the grid in a non-uniform manner.

9. The magnetic field detector of claim 2, wherein the superconducting interconnecting paths form a grid and SQUIDs are disposed in the grid in a spatial arrangement such the SQUIDs are off-centered with respect to each other such that the spatial arrangement of SQUIDs is configured to detect an amplitude and phase of radio frequency signals.

10. The magnetic field detector of claim 9, wherein the spatial arrangement is selected from the group consisting of a triangular array, a circular array, and a Lorentz array.

11. The magnetic field detector of claim 2, wherein the superconducting interconnecting paths form a three-dimensional grid array.

12. A superconducting quantum interference apparatus comprising:
    a grid of superconducting paths;
    a plurality of superconducting quantum interference devices (SQUIDs) disposed in an array on the grid of superconducting paths, wherein the superconducting paths are configured to connect the plurality of SQUIDs to each other; and
    wherein a section of the grid of superconducting paths has a different cross-sectional geometry with respect to a cross-sectional geometry of remaining sections in the grid.

13. The superconducting quantum interference apparatus of claim 12, wherein at least one of the SQUIDs in the array comprises Josephson junctions that have a different junction volume relative to Josephson junctions in remaining SQUIDs in the array.

14. The superconducting quantum interference apparatus of claim 12, wherein the array is divided into sub-sections, each of which has a distinct optimal operational temperature.

15. The superconducting quantum interference apparatus of claim 12, wherein the section of the grid of superconducting paths that has a different cross-sectional geometry with respect to the cross-sectional geometry of remaining sections in the grid is defined by at least one Josephson junction in at least one of the SQUIDs that has a different cross-sectional geometry with respect to the cross-sectional geometry of interconnecting superconducting paths in the grid.

16. A magnetic field detector for detecting magnetic fields over a broad operational temperature range comprising:
    a plurality of Josephson junctions connected to each other by superconducting interconnecting paths, wherein the plurality of Josephson junctions are arranged in an array; and
    wherein at least one of the Josephson junctions in the array has a different junction cross-sectional geometry relative to remaining Josephson junctions in the array such that the Josephson junctions in the array are not all uniform.

17. The magnetic field detector of claim 16, wherein the at least one of the Josephson junctions in the array has a different junction thickness relative to remaining Josephson junctions in the array.

18. The magnetic field detector of claim 16, wherein the at least one of the Josephson junctions in the array has a different junction width relative to remaining Josephson junctions in the array.

19. The magnetic field detector of claim 16, wherein the array is divided into sub-sections, each of which comprises Josephson junctions designed to operate optimally at a distinct optimal temperature so that at any given operational temperature, within a predefined temperature range, at least one sub-section is configured to operate optimally and remaining sub-sections are configured to operate at an acceptable, albeit degraded, level of performance.

20. The magnetic field detector of claim 16, wherein the array is divided into sub-sections, each of which comprises Josephson junctions designed to operate optimally at a distinct optimal temperature, and wherein the magnetic field detector of claim 13 further comprises:
- a temperature sensor configured to measure a local temperature; and
- a processor communicatively coupled to the temperature sensor and to the Josephson junctions and configured to gate out sub-sections if their corresponding optimal temperatures fall outside an acceptable temperature range based on the local temperature.

* * * * *